United States Patent [19]
Lee

[11] Patent Number: 6,049,186
[45] Date of Patent: Apr. 11, 2000

[54] METHOD FOR MAKING AND OPERATING AN EXPOSURE APPARATUS HAVING A REACTION FRAME

[75] Inventor: Martin E. Lee, Saratoga, Calif.

[73] Assignee: Nikon Corporation, Tokyo, Japan

[21] Appl. No.: 09/127,288

[22] Filed: Jul. 31, 1998

Related U.S. Application Data

[63] Continuation of application No. 08/627,824, Apr. 2, 1996, Pat. No. 5,942,871, which is a continuation of application No. 08/221,375, Apr. 1, 1994, Pat. No. 5,528,118.

[51] Int. Cl.⁷ .................................................. G05B 5/01
[52] U.S. Cl. .......................................... 318/611; 318/649
[58] Field of Search ..................................... 318/560–575, 318/640, 648, 649, 611; 74/479.01, 480 R, 490.07–490.1; 248/638; 378/34

[56] References Cited

U.S. PATENT DOCUMENTS

| | | | |
|---|---|---|---|
| Re. 27,289 | 2/1972 | Sawyer | 318/38 |
| Re. 27,436 | 7/1972 | Sawyer | 346/29 |
| 3,789,285 | 1/1974 | Nishizawa | 318/687 |
| 3,889,164 | 6/1975 | Nishizawa et al. | 318/640 |
| 3,935,486 | 1/1976 | Nagashima | 310/12 |
| 3,943,778 | 3/1976 | Wyse | 74/5 F |
| 4,019,109 | 4/1977 | McCoy et al. | 318/640 |
| 4,087,729 | 5/1978 | Yamazaki et al. | 318/601 |
| 4,129,291 | 12/1978 | Kato et al. | 269/71 |
| 4,234,175 | 11/1980 | Imahashi et al. | 318/649 |
| 4,392,642 | 7/1983 | Chitayat | 269/73 |
| 4,409,860 | 10/1983 | Moriyama et al. | 74/479 |
| 4,425,508 | 1/1984 | Lewis, Jr. et al. | 250/442.1 |
| 4,443,743 | 4/1984 | Forys et al. | 318/115 |
| 4,485,339 | 11/1984 | Trost | 318/640 |
| 4,492,356 | 1/1985 | Taniguchi et al. | 248/346 |
| 4,504,144 | 3/1985 | Trost | 356/150 |
| 4,506,204 | 3/1985 | Galburt | 318/653 |
| 4,506,205 | 3/1985 | Trost et al. | 318/653 |
| 4,507,597 | 3/1985 | Trost | 318/653 |
| 4,514,858 | 4/1985 | Novak | 378/34 |
| 4,516,253 | 5/1985 | Novak | 378/34 |
| 4,525,669 | 6/1985 | Imahashi et al. | 318/649 |
| 4,575,942 | 3/1986 | Moriyama | 33/1 M |
| 4,615,515 | 10/1986 | Suzuta et al. | 269/73 |
| 4,628,238 | 12/1986 | Smulders et al. | 318/653 |
| 4,630,942 | 12/1986 | Tsumaki et al. | 384/8 |
| 4,641,071 | 2/1987 | Tazawa et al. | 318/640 |
| 4,648,723 | 3/1987 | Sugiyama et al. | 384/9 |

(List continued on next page.)

FOREIGN PATENT DOCUMENTS 63-20014   4/1988   Japan .

OTHER PUBLICATIONS

Moriyama et al., Japan Society of Precision Engineering, vol. 22, No. 1, Mar. 1988, pp. 13–17.

*Primary Examiner*—Brian Sircus
*Attorney, Agent, or Firm*—Oliff & Berridge, PLC

[57] ABSTRACT

A guideless stage for aligning a wafer in a microlithography system is disclosed, and a reaction frame is disclosed which isolates both external vibrations as well as vibrations caused by reaction forces from an object stage. In the guideless stage an object stage is disclosed for movement in at least two directions and two separate and independently movable followers move and follow the object stage and cooperating linear force actuators are mounted on the object stage and the followers for positioning the object stage in the first and second directions. The reaction frame is mounted on a base structure independent of the base for the object stage so that the object stage is supported in space independent of the reaction frame. At least one follower is disclosed having a pair of arms which are respectively movable in a pair of parallel planes with the center of gravity of the object stage therebetween. The linear positioning forces of the actuator drive means are mounted and controlled so that the vector sum of the moments of force at the center of gravity of the object stage due to the positioning forces of the drive means is substantially equal to zero. The actuator mounting means can include at least two thin flexible members mounted in series with the primary direction of flex of the members being orthogonal to one another.

65 Claims, 11 Drawing Sheets

U.S. PATENT DOCUMENTS

| | | | |
|---|---|---|---|
| 4,648,724 | 3/1987 | Sugiyama et al. | 384/9 |
| 4,653,408 | 3/1987 | Nagashima et al. | 108/20 |
| 4,654,571 | 3/1987 | Hinds | 318/687 |
| 4,667,139 | 5/1987 | Hirai et al. | 318/687 |
| 4,675,891 | 6/1987 | Plessis et al. | 378/132 |
| 4,677,651 | 6/1987 | Hartl et al. | 378/132 |
| 4,684,315 | 8/1987 | Sugishima et al. | 414/749 |
| 4,687,980 | 8/1987 | Phillips et al. | 318/640 |
| 4,698,575 | 10/1987 | Bouwer | 318/640 |
| 4,708,465 | 11/1987 | Isohata et al. | 355/53 |
| 4,723,086 | 2/1988 | Leibovich et al. | 310/328 |
| 4,742,286 | 5/1988 | Phillips | 318/640 |
| 4,744,675 | 5/1988 | Sakino et al. | 384/12 |
| 4,750,721 | 6/1988 | Sasada | 269/73 |
| 4,770,531 | 9/1988 | Tanaka et al. | 356/358 |
| 4,803,712 | 2/1989 | Kembo et al. | 378/34 |
| 4,808,892 | 2/1989 | Dreibelbis | 318/135 |
| 4,812,725 | 3/1989 | Chitayat | 318/625 |
| 4,817,930 | 4/1989 | Van Deuren | 269/73 |
| 4,870,668 | 9/1989 | Frankel et al. | 378/34 |
| 4,887,804 | 12/1989 | Ohtsuka | 269/73 |
| 4,891,526 | 1/1990 | Reeds | 250/441.1 |
| 4,916,340 | 4/1990 | Negishi | 310/12 |
| 4,948,330 | 8/1990 | Nomura et al. | 414/749 |
| 4,952,858 | 8/1990 | Galburt | 318/560 |
| 5,022,619 | 6/1991 | Mamada | 248/178 |
| 5,040,431 | 8/1991 | Sakino et al. | 74/479 |
| 5,059,090 | 10/1991 | Bobroff et al. | 414/749 |
| 5,073,912 | 12/1991 | Kobayashi et al. | 378/34 |
| 5,120,034 | 6/1992 | Van Engelen et al. | 269/73 |
| 5,140,242 | 8/1992 | Doran et al. | 318/640 |
| 5,150,153 | 9/1992 | Franken et al. | 355/53 |
| 5,172,160 | 12/1992 | Van Eijk et al. | 355/53 |
| 5,228,358 | 7/1993 | Sakino et al. | 74/479 R |
| 5,241,183 | 8/1993 | Kanai et al. | 250/453.11 |
| 5,243,491 | 9/1993 | Van Eijk et al. | 361/144 |
| 5,260,580 | 11/1993 | Itoh et al. | 250/492.2 |
| 5,280,677 | 1/1994 | Kubo et al. | 33/568 |
| 5,285,142 | 2/1994 | Galburt et al. | 318/40 |
| 5,309,847 | 5/1994 | Matsumoto | 108/143 |
| 5,323,712 | 6/1994 | Kikuiri | 108/20 |
| 5,327,060 | 7/1994 | Van Engelen et al. | 318/640 |
| 5,385,217 | 1/1995 | Watanabe et al. | 188/267 |
| 5,400,674 | 3/1995 | Arnone et al. | 74/490.13 |
| 5,453,315 | 9/1995 | Hamilton et al. | 428/209 |
| 5,467,720 | 11/1995 | Korenaga et al. | 108/20 |
| 5,471,802 | 12/1995 | Yano et al. | 52/126.6 |
| 5,508,518 | 4/1996 | Kendall | 250/492.2 |
| 5,524,502 | 6/1996 | Osanai | 74/490.07 |
| 5,528,118 | 6/1996 | Lee | 318/568.17 |
| 5,530,516 | 6/1996 | Sheets | 355/53 |
| 5,578,164 | 11/1996 | Kurono et al. | 216/71 |
| 5,623,853 | 4/1997 | Novak et al. | 74/490.09 |
| 5,744,924 | 4/1998 | Lee | 318/568.17 |
| 5,942,871 | 8/1999 | Lee | 318/611 | ns
METHOD FOR MAKING AND OPERATING AN EXPOSURE APPARATUS HAVING A REACTION FRAME

RELATED APPLICATIONS

This application is a continuation of Ser. No. 08/627,824, filed Apr. 2, 1996, now U.S. Pat. No. 5,942,871, which is a continuation of Ser. No. 08/221,375, filed Apr. 1, 1994, now U.S. Pat. No. 5,528,118.

FIELD OF INVENTION

The present invention relates, in general, to electro-mechanical alignment and isolation and, more particularly, to such method and apparatus for supporting and aligning a wafer in a microlithographic system and isolating the system from its own reaction forces and external vibrations.

BACKGROUND OF THE INVENTION

Various support and positioning structures are known for use in microlithographic instruments. Typically, in the prior art, XY guides, including a separate X guide assembly and Y guide assembly, are utilized with one guide assembly mounted on and movable with the other guide assembly. Often, a separate wafer stage is mounted on top of these guide assemblies. These structures require high precision and many parts. Typically, external forces directed to parts of the positioning assembly and reaction forces due to movement of different parts of the assembly are coupled directly to the image forming optics and reticle handling equipment resulting in unwanted vibration.

U.S. Pat. No. 5,120,036 to Van Engelen et al. describes a two-step positioning device using Lorentz forces and a static gas bearing for an opto-lithographic device.

U.S. Pat. No. 4,952,858 is directed to a microlithographic apparatus utilizing electromagnetic alignment apparatus including a monolithic stage, a sub-stage and isolated reference structure in which force actuators imposed between the monolithic stage and the sub-stage are used for suspending and positioning the monolithic stage in space. In this apparatus a Y frame or stage is mounted on an X frame and the monolithic stage is positioned from and supported in space from the Y frame.

SUMMARY OF THE INVENTION

Broadly stated, the present invention is directed to method and apparatus utilizing a guideless stage for supporting an article and incorporating a reaction frame which isolates both external forces as well as reaction forces created in moving the object from other elements of the system such as a lens system which produces an image that is exposed on the photoresist of a wafer object surface.

The present invention incorporates an object stage, a reaction frame mounted on a base and substantially free from transferring vibrations between itself and the object stage, means for supporting the object stage in space independent of the reaction frame and cooperating force type linear actuator means mounted on the object stage and the reaction frame for positioning of the object stage. The object stage can be mounted for movement in a given direction or can constitute a XY stage for movement in the X and Y directions while being supported in space in the Z direction.

A feature, an advantage of this invention is the provision of a support, positioning and isolation assembly which allows the positioning function of the object or wafer stage to be accomplished while minimizing vibrations coupled to the stage and lens systems from the reaction stage faster and with fewer parts while minimizing vibrations coupled to the stage and isolating the stage from undesired reaction forces.

In accordance with another aspect of the present invention, a positioning method and apparatus are provided for an XY stage with an independently moveable X follower and independently moveable Y follower and cooperating linear force actuators mounted between the stage and followers whereby the movement of either follower does not effect the movement of the other follower.

Another aspect of this invention is the provision on at least one follower of a pair of arms on the follower with each arm supporting a drive member and wherein the arms are positioned and movable in spaced apart planes above and below the center of gravity of the object stage.

In accordance with another aspect of the present invention, the guideless stage incorporates at least three linear force actuators with two of those actuators driving in one of the X or Y directions and the third actuators driving in the other of the X and Y directions. In accordance with the preferred embodiment of this invention the guideless stage incorporates at least four linear actuators operating between the XY stage and a reaction frame assembly with each actuator including a drive member on the XY stage so that a pair of X drive members serve to drive the XY stage in an X direction and a pair of Y drive members serve to drive the XY stage in the Y direction. The linear actuators and their drive members are constructed, positioned and controlled such that the vector sum of the moments of force at the center of gravity of the XY stage due to the positioning forces of cooperating drive members is substantially equal to zero.

These features and advantages of the present invention will become more apparent upon perusal of the following specification taken in conjunction with the following drawing wherein similar characters of reference refer to similar parts in each of the several views.

DETAILED DESCRIPTION OF THE PREFERRED EMBODIMENT

While it will be appreciated by those skilled in the art that the guideless stage, with or without its isolating reaction frame, has many applications to many different types of instruments for precise positioning of objects, the present invention will be described with respect to a preferred embodiment in the form of a microlitholigraphic instrument for aligning wafers in a system where a lens produces an image which is exposed to the photoresist on the wafer surface. In addition, while the guideless stage with or without its isolation stage can be utilized as a guideless object stage movable in just one direction, such as a X or a Y direction, the preferred embodiment is directed to a guideless XY wafer stage as described below.

Figure 1:
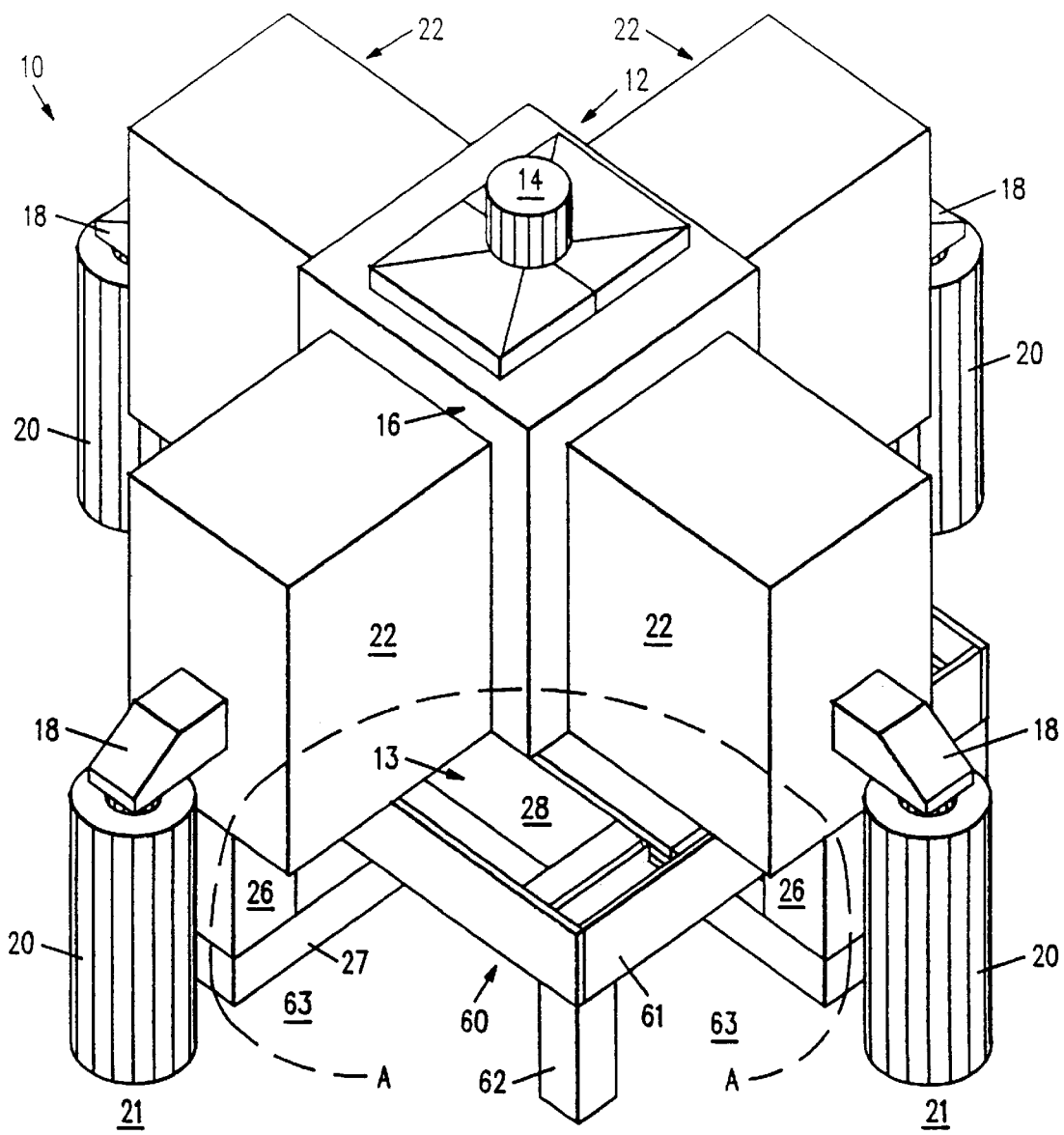
FIG. 1 is a perspective view of a microlithography system incorporating the present invention.
Figure 2:
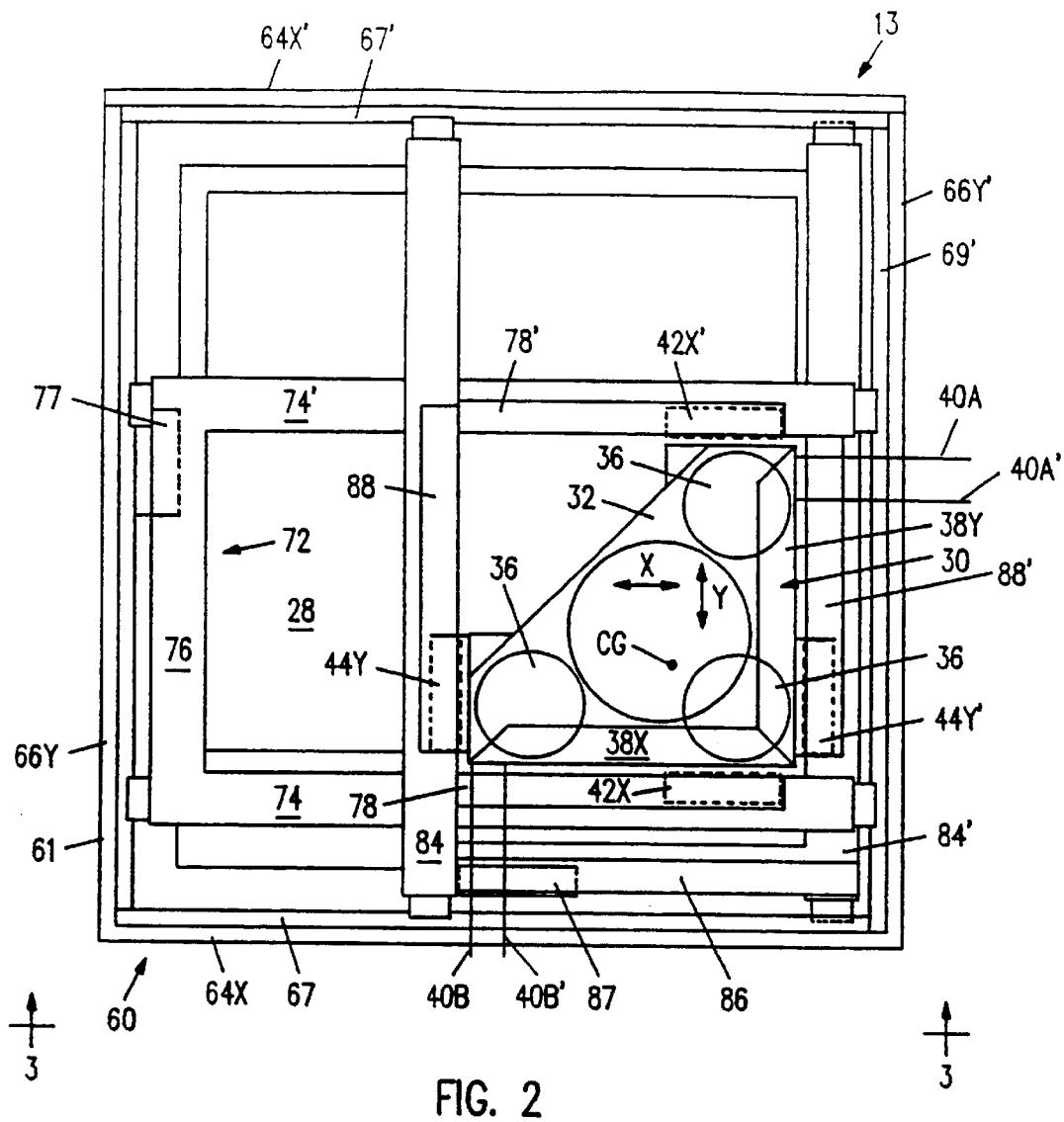
FIG. 2 is a plan view of the wafer XY stage position above the reaction stage.

Referring now to the drawings, with particular reference to FIGS. 1 and 2, there is shown a photolithographic instrument 10 having an upper optical system 12 and a lower wafer support and positioning system 13. The optical system 12 includes an illuminator 14 including a lamp LMP, such as a mercury lamp, and an ellipsoid mirror EM surrounding the lamp LPM. And the illuminator 14 comprises optical integrator such as a fly's eye lens FEL producing secondary light source images and a condenser lens CL for illuminating a reticle (mask) R with uniformed light flux. A mask holder RST holding the mask R is mounted above a lens barrel PL of a projection optical system 16. The lens barrel PL is fixed on a part of a column assembly which is supported on a plurality of rigid arms 18 each mounted on the top portion of an isolation pad or block system 20.

Figure 1A:
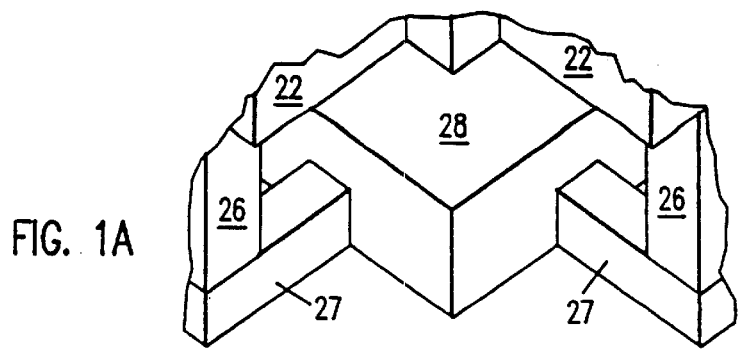
FIG. 1A is a view of a portion of the structure shown in FIG. 1 delineated by line A—A and with the reaction stage which is shown FIG. 1 removed.
Figure 1B:
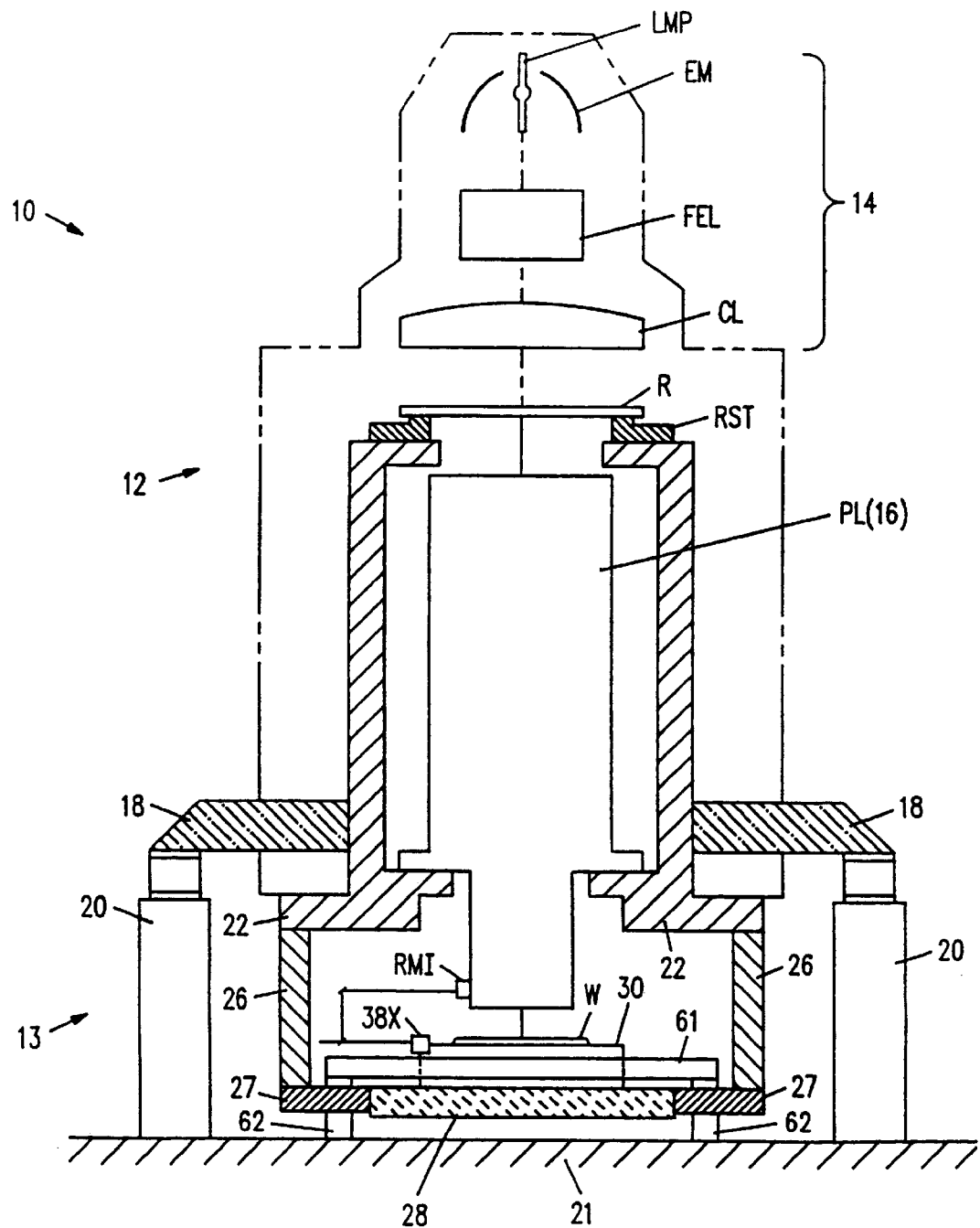
FIG. 1B is an elevational view, partially in section, of the structure shown in FIG. 1.

Inertial or seismic blocks 22 are located on the system such as mounted on the arms 18. These blocks 22 can take the form of a cast box which can be filled with sand at the operation site to avoid shipment of a massive structure. An object or wafer stage base 28 is supported from the arms 18 by depending blocks 22 and depending bars 26 and horizontal bars 27 (see FIG. 1A). FIG. 1B is an elevational view, partially in section, of the structure shown in FIG. 1 except that in FIG. 1B, the blocks 22 are shown as being a different configuration than in FIGS. 1 and 1A.

Figure 3:
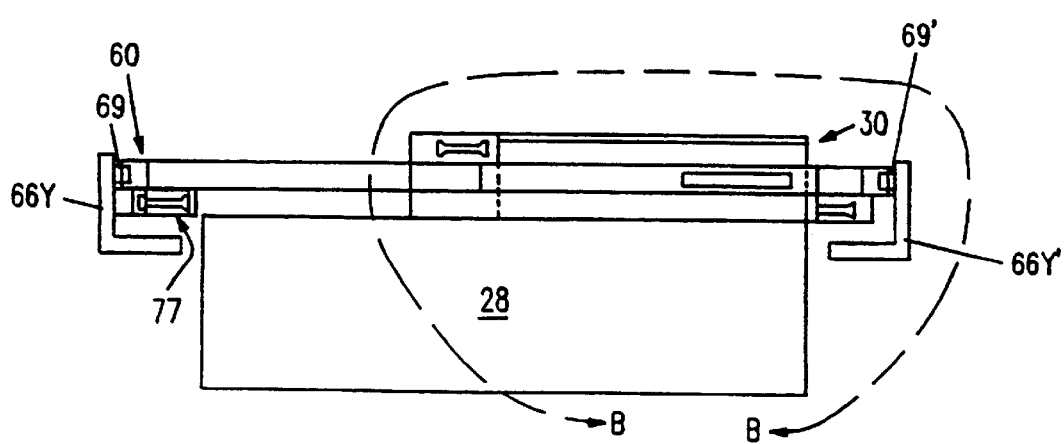
FIG. 3 is a side elevational view of a portion of the structure shown in FIG. 2 taken along line 3—3 in the direction of the arrows.
Figure 3A:
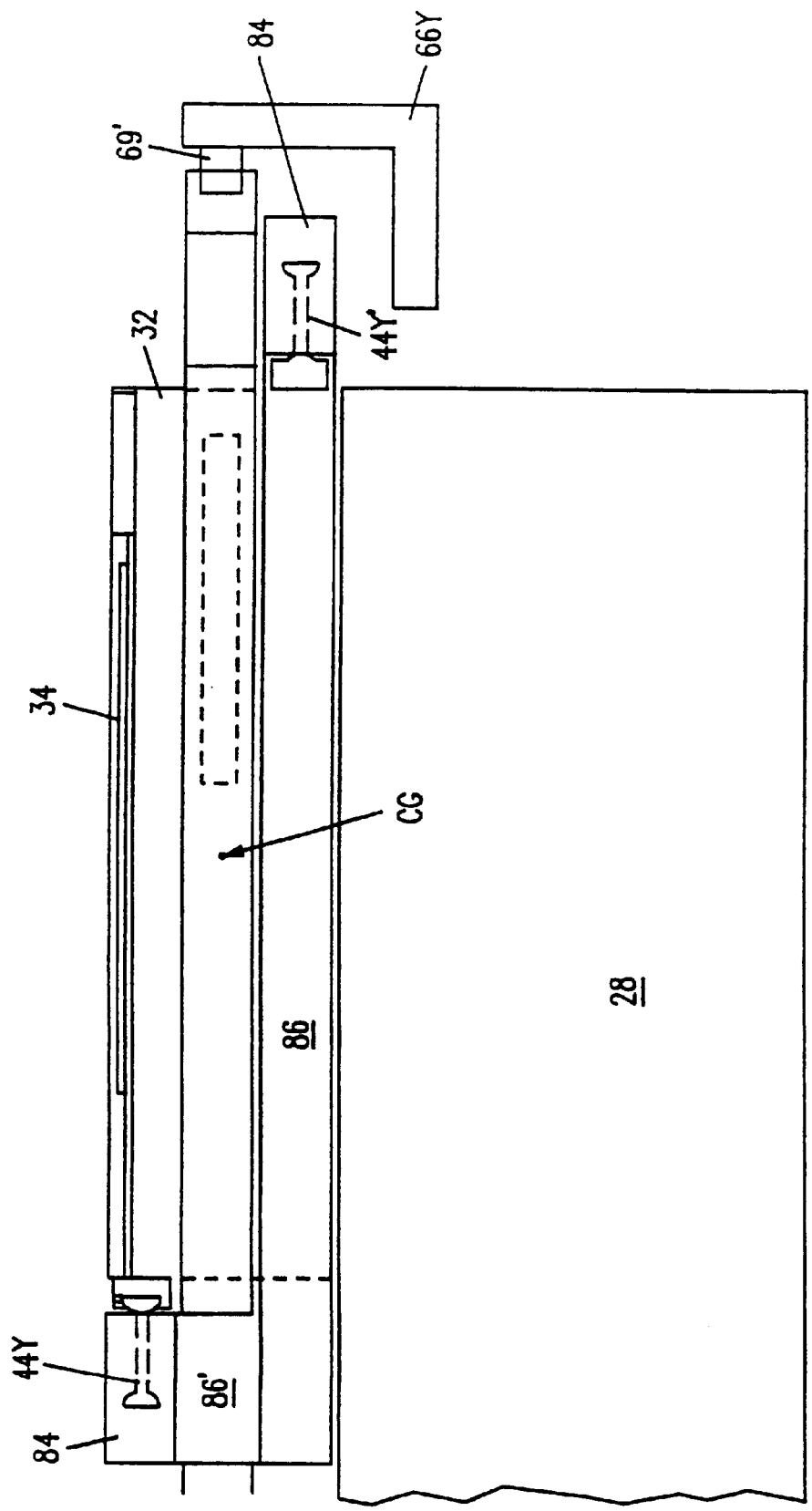
FIG. 3A is an enlarged view of a portion of the structure shown in FIG. 3 delineated by line B—B.

Referring now to FIGS. 2 and 3, there are shown plan and elevational views, respectively, of the wafer supporting and positioning apparatus above the object or wafer stage base 28 including the object or wafer or XY stage 30 and the reaction frame assembly 60. The XY stage 30 includes a support plate 32 on which the wafer 34, such as a 12 inch wafer, is supported. The plate 32 is supported in space above the object stage base 28 via vacuum pre-load type air bearings 36 which can be controlled to adjust Z, i.e., tilt roll and focus. Alternatively, this support could employ combinations of magnets and coils.

The XY stage 30 also includes an appropriate element of a magnetic coupling means such as a linear drive motor for aligning the wafer with the lens of the optical system 16 for precisely positioning an image for exposure of a photoresist on the wafer's surface. In the embodiment illustrated, the magnetic coupling means takes the form of a pair of drive members such as X drive coils 42X and 42X' for positioning the XY stage 30 in the X direction and a pair of Y drive members such as drive coils 44Y and 44Y' for positioning the XY stage 30 in the Y direction. The associated portion of the magnetic coupling means on the reaction frame assembly 60 will be described in later detail below.

The XY stage 30 includes a pair of laser mirrors 38X operative with respect to a pair of laser beams 40A/40A' and 38Y operative with respect to a pair of laser beams 40B/40B' of a laser beam interferometer system 92 for determining and controlling the precise XY location of the XY stage relative to a fixed mirror RMX at the lower part of the lens barrel PL of the projection optical system 16.

Figure 4:
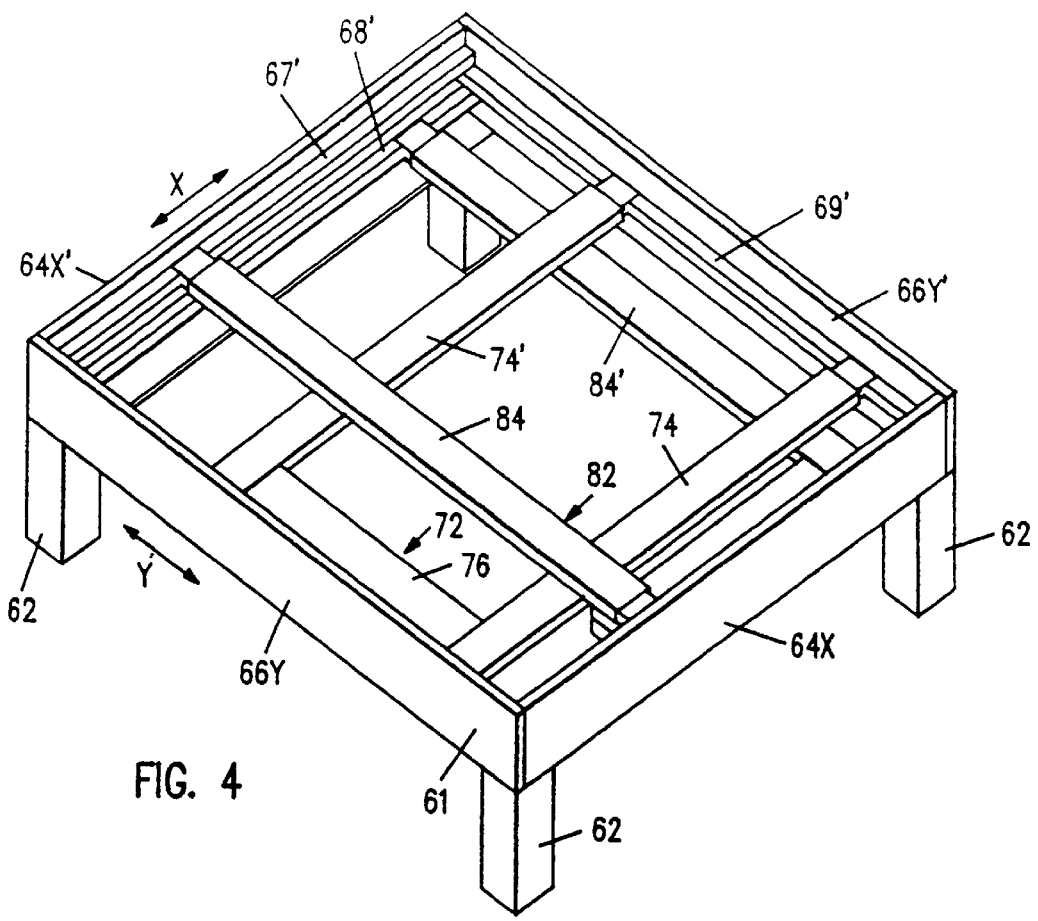
FIG. 4 is a perspective view of the reaction stage showing the XY followers without the means for coupling to the XY stage for positioning of the XY stage.
Figure 4A:
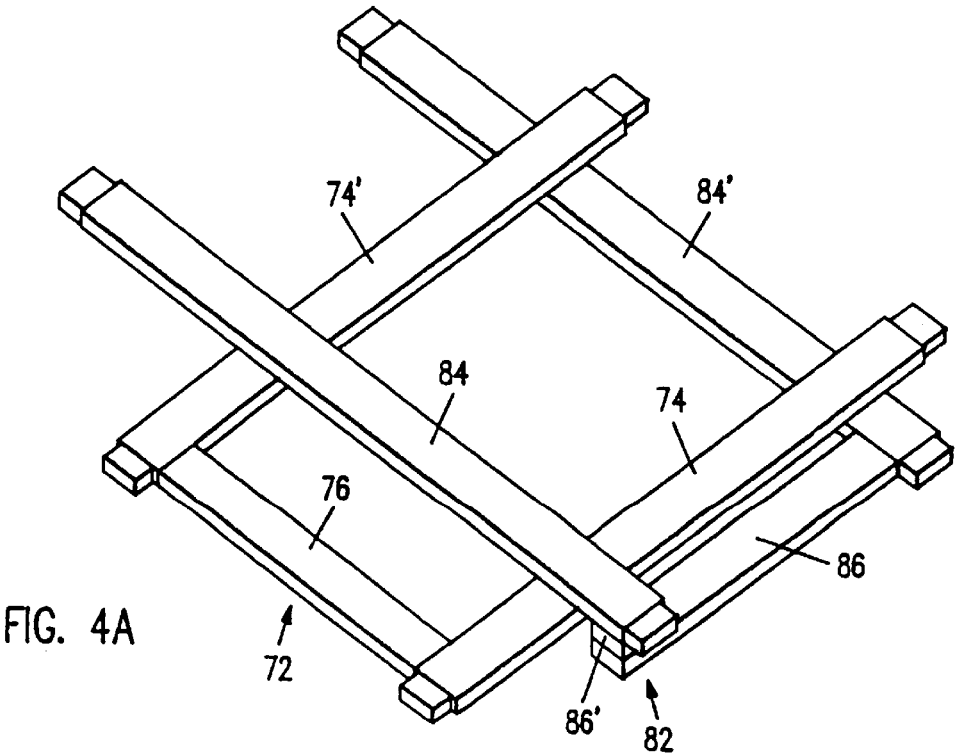
FIG. 4A is an enlarged perspective view of the XY followers illustrated in FIG. 4.

Referring to FIGS. 4 and 4A, the reaction frame assembly 60 has a reaction frame 61 which includes a plurality of support posts 62 which are mounted on the ground or a separate base substantially free from transferring vibrations between itself and the object stage.

The reaction frame 61 includes face plates 64X and 64X' extending between support posts 62 in the X direction and 66Y and 66Y' extending between support posts in the Y direction. Inside the face plates 64–66 a plurality of reaction frame rails 67–69 and 67'–69' are provided for supporting and guiding an X follower 72 and a Y follower 82. Inside face plate 64X are an upper follower guide rail 67 and a lower follower guide rail 68 (not shown) and on the inside surface of the opposite face plate 64X' are upper and lower follower guide rails 67' and 68'. On the inside surfaces of each of the face plates 66Y and 66Y' is a single guide rail 69 and 69', respectively, which is positioned vertically in between the guide rails 67 and 68.

The X follower includes a pair of spaced apart arms 74 and 74' connected at their one end by a cross piece 76. Drive elements such as drive tracks 78 and 78' (see FIG. 2) are mounted on the arms 74 and 74', respectively, for cooperating with the drive elements 42X and 42X' of the XY stage. Since in the illustrated embodiment the drive elements 42X and 42X' on the XY stage are shown as drive coils, the drive tracks on the X follower 72 take the form of magnets. The coupling elements could be reversed so that the coils would be mounted on the X follower and the magnets mounted on the XY stage. As the XY stage is driven in the X and Y direction, the laser interferometer system 92 detects the new position of the XY stage momentarily and generates a position information (X coordinate value). As described in greater detail below with reference to FIG. 5, a servo position control system 94 under control of a host processor (CPU) 96 controls the position of the X follower 72 and the y follower 82 in response to the position information from the interferometer system 92 to follow the XY stage 30 without any connection between the drive coils 42X,42X' and the tracks 74,74'.

For movably mounting the X follower 72 on the reaction frame 61, the ends of the arms 74 and 74' at the side of the reaction frame 61 ride or are guided on the rail 69, and the opposite ends of the arms 74 and 74' ride on rail 69' adjacent face plate 66 Y'. For moving the X follower 72 a drive member 77 is provided on the cross piece 76 for cooperating with the reaction frame guide 69 for moving the follower 72 in a direction which is perpendicular to the X direction of the XY stage. Since the precision drive and control takes place in the XY stage 30, the positioning control of the X follower 72 does not have to be as accurate and provide as close tolerances and air gaps as the XY stage 30. Accordingly, the drive mechanism 77 can be made of a combination of a screw shaft rotated by a motor and a nut engaged by the X follower 72 or a combination of a coil assembly and a magnet assembly to establish a linear motor and each combination can be further combined with a roller guiding mechanism.

Similar to the X follower 72, the Y follower 82 includes a pair of arms 84 and 84' connected at their one end by a crossbar 86 and including drive tracks 88 and 88' for cooperating with the Y drive members 44Y and 44Y'. The arms 84 and 84' of the Y follower 82 are guided on separate guide rails. The ends of arm 84 ride or are guided on the upper rails 67 and 67' and the ends of arm 84' are guided on lower rails 68 and 68'. A drive mechanism 87 is provided on the cross piece 86 of the Y follower 82 for moving the Y follower 82 along guides 67, 67', 68 and 68' between the face plates 66Y and 66Y' in a direction perpendicular to the Y direction of the XY stage.

As best illustrated in FIG. 4A, the arms 74 and 74' and crossbar 76' of the X follower 72 all lie within and move in the same plane crossing the Z axis. The center of gravity of the XY stage 30 lies within or is immediately adjacent to this plane. In this construction the drive forces from each of the drive coils 42X and 42X' are in a direction along the length of the arms 74 and 74', respectively. However, the arms 84 and 84' of the Y follower 82 lie within and move in different parallel planes spaced apart along the Z axis from one another respectively above and below and parallel to the plane containing the X follower 72. In the preferred embodiment, the crossbar 86 lies in the lower plane containing the arm 84' and a spacer block 86' is positioned between the overlapping ends of the arm 84 and crossbar 86 to space the arms 84 and 84' in their respective parallel planes. As with X follower 72, the drive forces from each of the drive coils 44Y and 44Y' are in a direction along the length of the arms 84 and 84'. Also, predetermined gaps in X and Z directions are maintained between the drive coils 44Y(44Y') and the drive tracks 88(88') to achieve the guideless concept.

In operation of the guideless stage and isolated reaction frame of the present invention, the XY stage 30 is positioned in an initial position relative to the projection lens as sensed by the interferometer system 92, and the XY stage 30 is supported in the desired Z direction from the object stage base 28 by the air bearings 36 with the drive coils 42X, 42X', 44Y and 44Y' spaced from the drive elements in the form of drive tracks 78, 78', 88 and 88', respectively. There is no direct contact between the XY stage 30 and the reaction frame 61. That is, there is no path for the vibration of the reaction frame to affect the position of the XY stage and vice versa. There is only indirect contact via the transmission means that deliver the signals to the coils and the laser interferometer position sensing system which then transmits sensed position information to the controller which receives other commands to initiate drive signals which result in movement of the XY stage 30.

Figure 5:
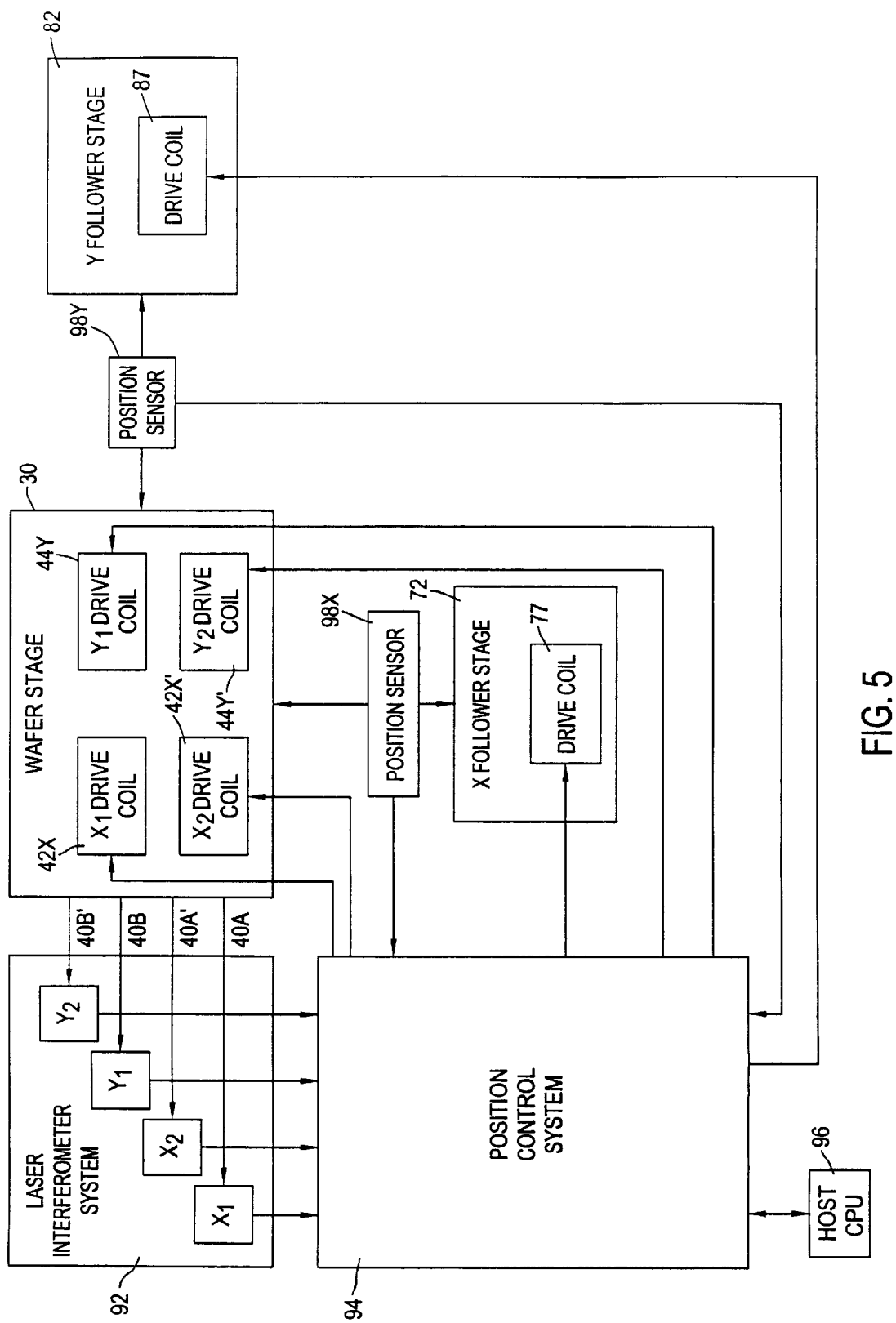
FIG. 5 is a schematic block diagram of the position sensing and control system for the preferred embodiment of this invention.

With the known position of the XY stage 30 from the interferometer system 92, drive signals are sent from the position control system 94 to the appropriate drive coils, 42X, 42X', 44Y and 44Y' to drive the XY stage to a new desired position. The motion of the XY stage is sensed by the interferometer system 92 and position sensors 98X and 98Y (see FIG. 5), and the X follower 72 and Y follower 82 are driven by the drive members 77 and 87, respectively, to follow the XY stage. As illustrated in FIG. 5, the position sensor 98X detects a variation of the Y direction space between the XY stage 30 and the X follower 72 and generates an electric signal representing the amount of space to the position control system 94. The position control system 94 generates a proper drive signal for the drive member 77 on the basis of the X position information from the interferometer system 92 and the signal from the position sensor 98X.

Also, the position sensor 98Y detects a variation of X direction space between the XY stage 30 and the Y follower 82 and generates an electric signal representing the amount of space, and the drive member 87 is energized on the basis of the Y position information from the interferometer system 92 and the signal from the position sensor 98Y.

Yaw correction is accomplished by the pairs of linear motors which can be used to hold or offset yaw, or the pairs of linear motors can change the rotational position of the XY stage. The data from either or both pairs of laser beams 40A/40A' and 40B/40B' are used to obtain yaw information. Electronic subtraction of digital position data obtained from measurement using the laser beams 40A and 40A' or 40B and 40B' is performed or both differences are added and divided by two.

This invention allows the positioning function of the XY stage to be accomplished faster than if XY guides were used. Reaction forces created in moving the XY stage can be coupled away from the image forming optics and reticle handling equipment.

This invention needs no precision X or Y guides as compared to a guided stage, and precision assembly and adjustment of the wafer XY stage is reduced due to the lack of precision guides. The servo bandwidth is increased because the linear motor forces in the XY axes act directly on the wafer stage; they do not have to act through a guide system.

Forces from the XY linear motors can all be sent substantially through the center of gravity of the XY stage thereby eliminating unwanted moments of force (torque).

With the X follower 72 and the Y follower 82 mounted and moved totally independently of one another, any vibration of a follower is not conveyed to the wafer XY stage or to the optical system when using commercially available electromagnetic linear motors for the magnetic coupling between each of the followers 72 and 82 and the XY stage 30 and with clearance between the coils and magnet drive tracks less than about 1 mm. Additionally, with the arms of one of the followers spaced above and below the arms of the other follower, the vector sum of the moments of force at the center of gravity of the XY stage due to the positioning forces of cooperating drive members is substantially equal to zero.

No connection exists between the XY stage and the follower stages that would allow vibrations to pass between them in the X, Y or θ degrees of freedom. This allows the follower stages to be mounted to a vibrating reference frame without affecting performance of the wafer stage. For example, if the reaction frame were struck by an object, the XY stage and the projection optical system would be unaffected.

It will be appreciated by a person skilled in the art that if the center of gravity is not equidistant between either of the two X drive coils or either of the two Y drive coils, that appropriate signals of differing magnitude would be sent to the respective coils to apply more force to the heavier side of the stage to drive the XY stage to the desired position.

For certain applications the drive elements 42X/42X' or 42Y/42Y' of the actuator or magnetic coupling assembly for supplying electro-magnetic force to the movable XY stage may be held stationary (see FIG. 5) in a static position with respect to movement of the stage in either the X or Y direction, respectively.

Figure 1C:
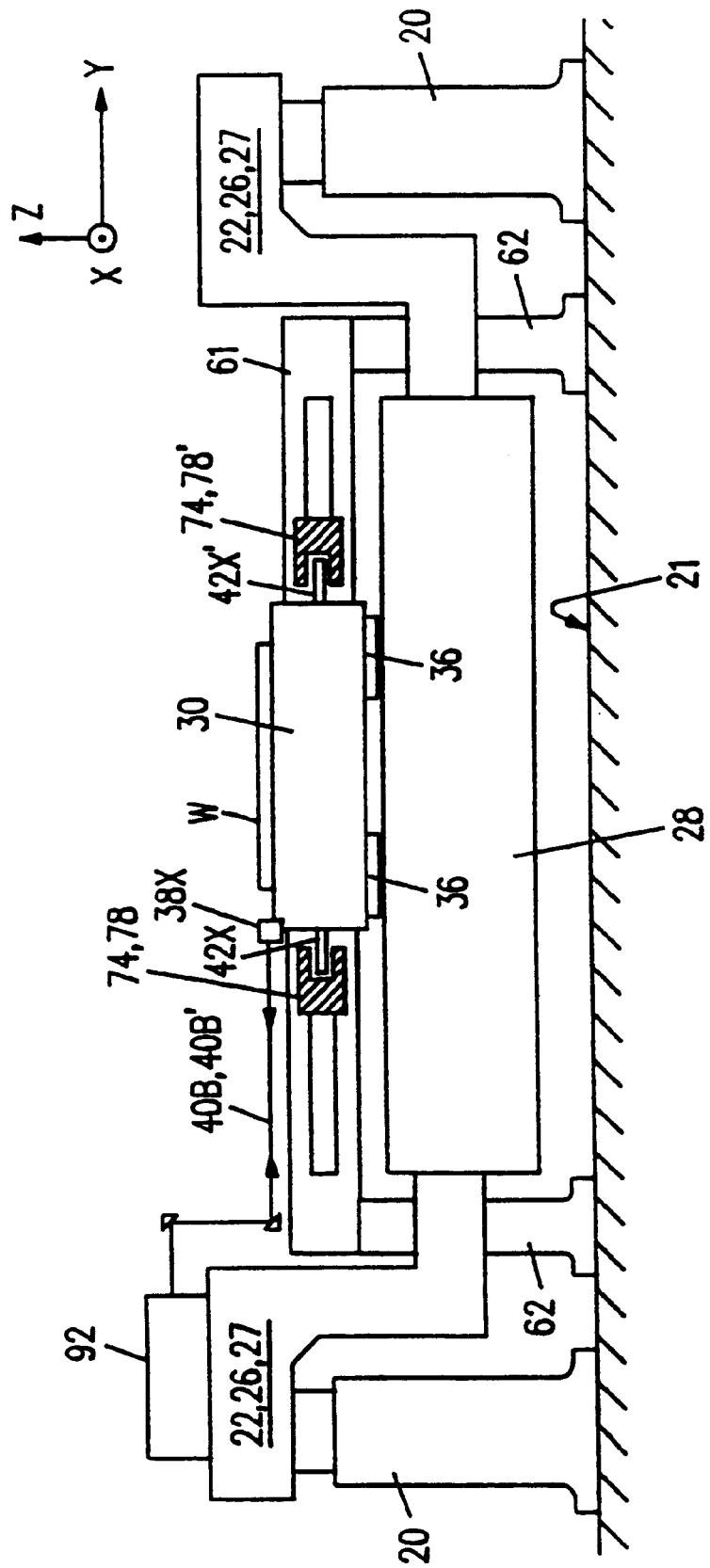
FIG. 1C is a schematic elevational view, partially in section, of the object positioning apparatus of the present invention.

In the last of the explanation of this embodiment, referring to FIG. 1C again, the essential structure of the present invention will be described. As illustrated in FIG. 1C, the XY stage 30 is suspended on the flat smooth surface (parallel with the X-Y plane) of the stage base 28 through the air bearings 36 having air discharge ports and vacuum pre-load ports and is movable in X,Y and θ direction on the stage base 28 without any friction.

The stage base 28 is supported on the foundation (or ground, base structure) 21 by the isolation blocks 20, arms 18, blocks 22, the vertical bars 26 and the horizontal bars 27. Each of the isolation blocks 20 is composed of a vibration absorbing assembly to prevent transmission of the vibration from the foundation 21.

Since FIG. 1C is a sectional view of the XY stage 30 along a line through the drive coils 42X,42X' in Y direction, the following description is restricted about the X follower 72.

In FIG. 1C, the drive coils 42X are disposed in a magnetic field of drive track (magnet array elongated in X direction) 78 mounted on the follower arm 74 and the drive coils 42X' are disposed in a magnetic field of drive track 78' mounted on the follower arm 74'.

The two arms 74,74' are rigidly assembled to move together in Y direction by the guide rails 69,69' formed inside of the reaction frame 61. Also, the guide rails 69,69' restrict the movement of the two arms 74,74' in X and Z directions. And the reaction frame 61 is directly supported on the foundation 21 by the four support posts 62 independently from the stage base 28.

Therefore, the drive coils 42X(42X') and the drive tracks 78 (78') are disposed with respect to each other to maintain a predetermined gap (a few millimeters) in Y and Z directions.

Accordingly, when the drive coils 42X,42X' are energized to move the XY stage 30 in X direction, the reaction force generated on the drive tracks 78,78' is transferred to the foundation 21, not to the XY stage 30.

On the other hand, as the XY stage 30 moves in Y direction, the two arms 74,74' are moved in Y direction by the drive-member 77 such that each of the drive tracks 78,78' follows respective coils 42X,42X' to maintain the gap in Y direction on the basis of the measuring signal of the position sensor 98X.

Figure 6:
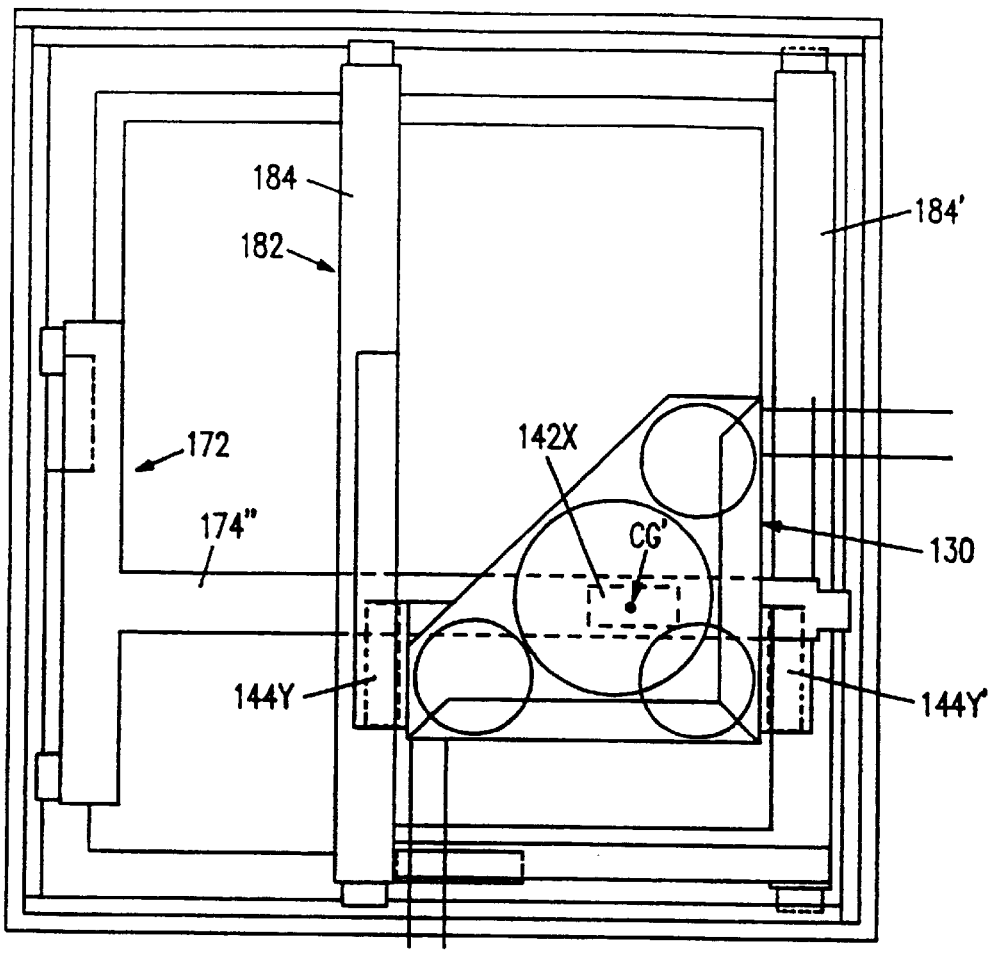
FIGS. 6 and 7 are views similar to FIGS. 2 and 3 of an alternative embodiment of the present invention.
Figure 7:
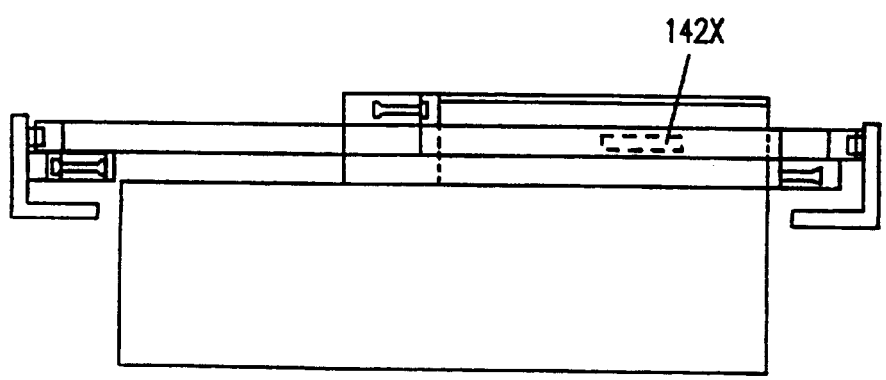
Figure 8:
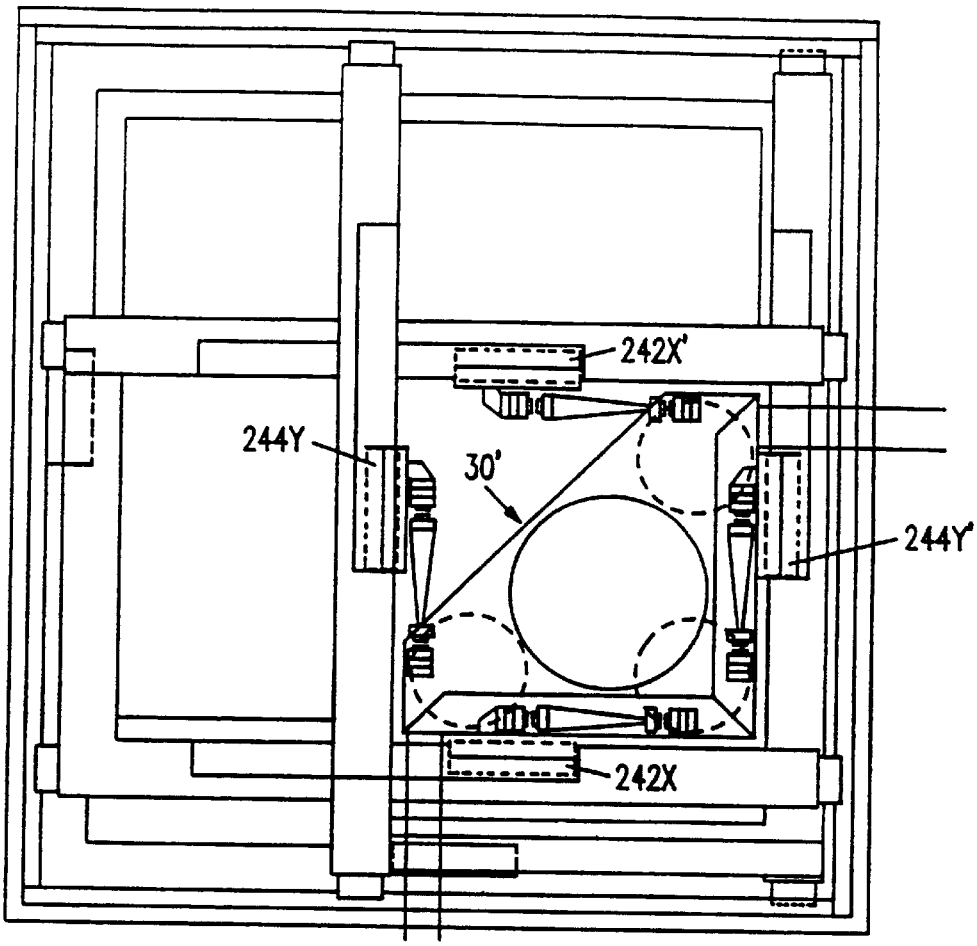
FIGS. 8 and 9 are views similar to FIGS. 2 and 3 of still another embodiment of the present invention.
Figure 9:
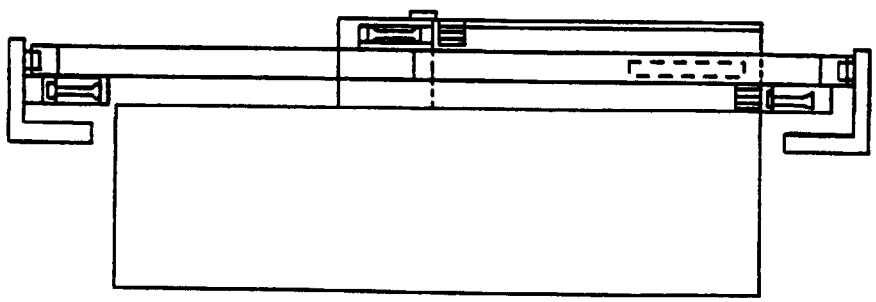
Figure 10:
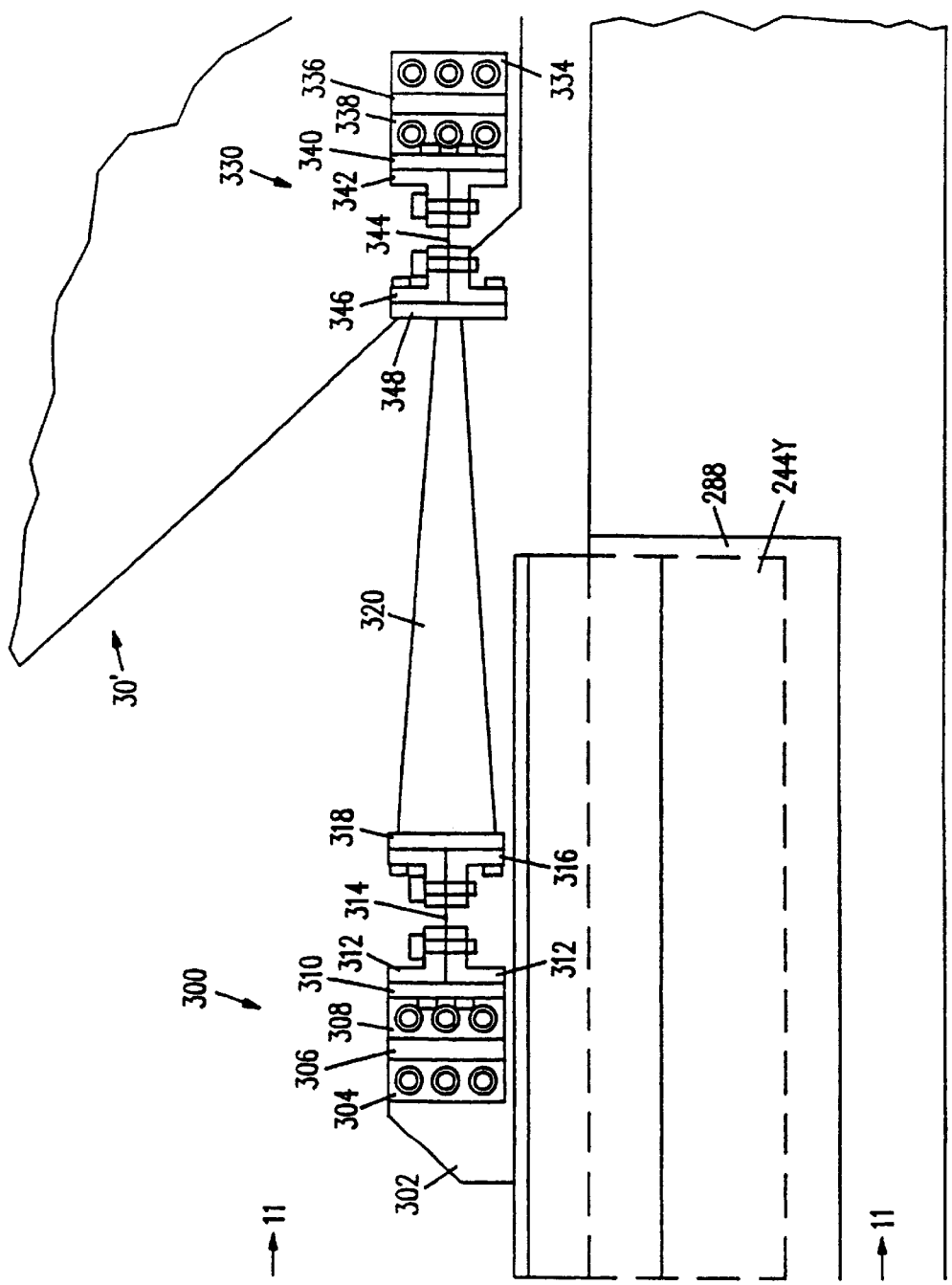
FIG. 10 is an enlarged top view of a portion of the structure shown in FIG. 8.

While the present invention has been described with reference to the preferred embodiment having a pair of X drive members or coils 42X and 42X' and a pair of Y drive members or coils 44Y and 44Y', it is possible to construct a guideless stage and with an isolated reaction frame in accordance with the invention with just three drive members or linear motors such as shown in FIGS. 6 and 7. As illustrated in FIG. 6, a pair of Y drive coils 144Y and 144Y' are provided on the stage 130 and a single X drive coil or linear motor 142X is mounted centered at the center of gravity CG' of the XY stage. The Y drive coils 144Y and 144Y' are mounted on the arms 184 and 184' of the Y follower 182, and the X drive coil 144X is mounted on an arm 174" of a X follower 172. By applying appropriate drive signals to the drive coils 142X and 144Y and 144Y', the XY stage can be moved to the desired XY positions.

Referring now to FIGS. 8–11, there is shown an alternative embodiment of the present invention which includes links between the XY drive coils 242X, 242X', 244Y and 244Y' and the attachment to the XY stage 30'. These connections include a double flexure assembly 300 connecting the drive coil 244Y to one end of a connecting member 320 and a double flexure assembly 330 connecting the other end of the connecting member 320 to the XY stage 30'. The double flexure assembly 300 includes a flange 302 connected to the coil 244Y. A clamping member 304 is attached via clamping bolts to the flange 302 to clamp therebetween one edge of a horizontal flexible link 306. The other end of the flexible lint 306 is clamped between two horizontal members 308 which are in turn integrally connected with a vertical flange 310 to which are bolted a pair of flange members 312 which clamp one edge of a vertical flexible member 314. The opposite edge of the vertical flexible member 314 is clamped between a pair of flange members 316 which are in turn bolted to a flange plate 318 on one end of the connecting member 320. At the other end of the connecting member 320 a plate 348 is connected to two flange members 36 which are bolted together to clamp one end of a vertical flexible member 344. The opposite edge of the vertical member 344 is clamped by flange members 342 which are in turn connected to a plate 340 connected to a pair of clamping plates 338 clamping one edge of a horizontal flexible member 336, the opposing edge of which is in turn clamped onto the XY stage 30' with the aid of the plate 334. Thus, in each of the double flexure assemblies 300 and 330 vibrations are reduced by providing both a horizontal and a vertical flexible member. In each of these assemblies the vertical flexible members reduce X, Y and θ vibrations and the horizontal flexible members reduce Z, tilt and roll vibrations. Thus, there are eight vertical flex joints for X, Y and θ and eight horizontal flex joints for Z, tilt and roll.

Figure 11:
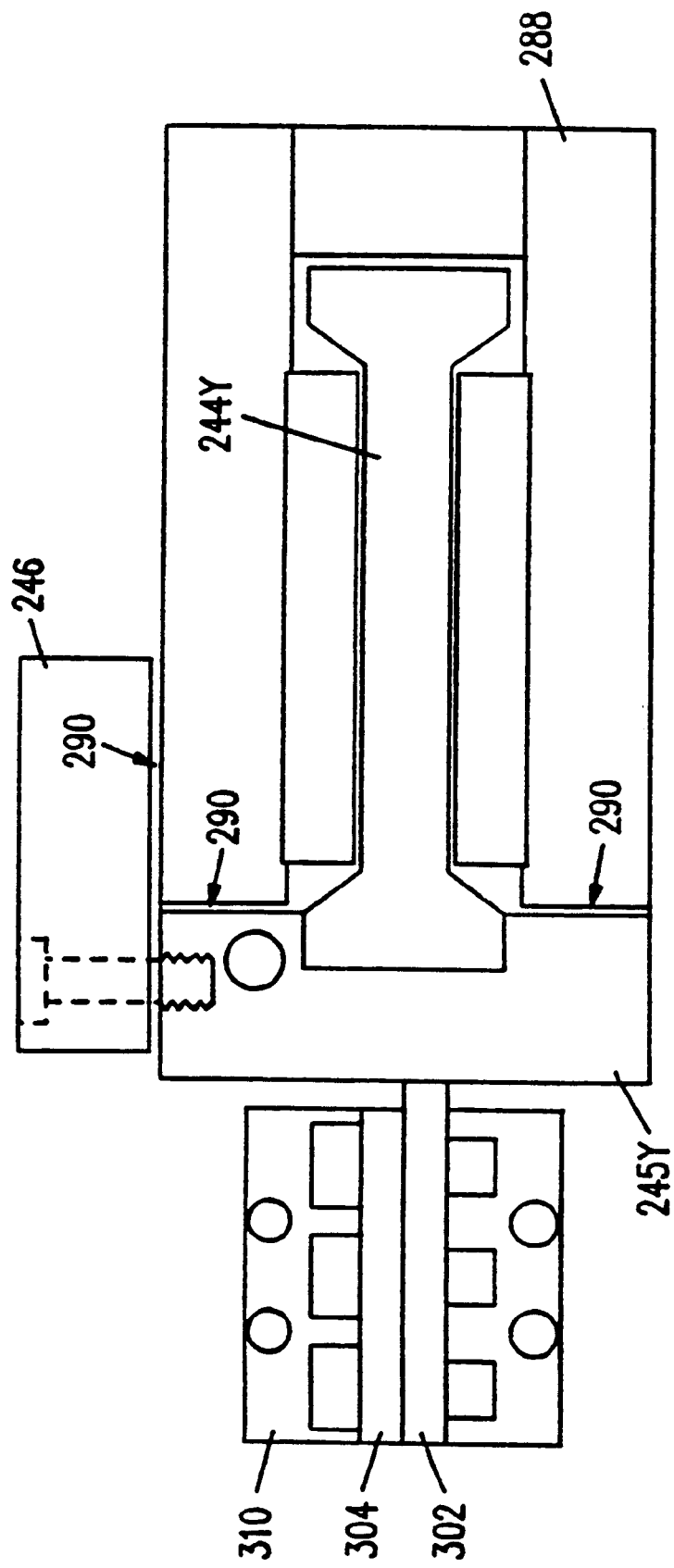
FIG. 11 is an end view of the structure shown in FIG. 10 taken along line 11—11 in the direction of the arrows.

As illustrated in FIG. 11, the coil 244Y is attached to a coil support 245Y which has an upper support plate 246 attached thereto which rides above the top of the magnetic track assembly 288. Vacuum pre-load type air bearings 290 are provided between the coil support 245Y and upper support plate 246 on the one hand and the magnetic track assembly 288 on the other hand.

In an operative example of the embodiment illustrated in FIGS. 8–11 the flexible members 306, 314, 344 and 336 are stainless steel 1¼" wide, ¼" long and 0.012" thick with the primary direction of flex being in the direction of the thickness. In the embodiment illustrated members 306 and 314 are mounted in series with their respective primary direction of flex being orthogonal to one another; members 344 and 336 are similarly mounted.

While the present invention has been described in terms of the preferred embodiment, the invention can take many different forms and is only limited by the scope of the following claims.

I claim:

1. A method for making an exposure apparatus which exposes an image onto an object, comprising:

providing a support structure;

providing an exposure device, supported on the support structure, to expose the image onto the object;

providing a stage movably supported by the support structure;

providing a reaction frame which is dynamically isolated from the support structure; and providing a drive, supported at least partly on the reaction frame, to move the stage, whereby a reaction force caused by the movement of the stage is transferred substantially to the reaction frame.

2. An object on which an image has been exposed by an exposure apparatus made by the method according to claim 1.

3. A method according to claim 1, wherein the support structure and the reaction frame are supported on a foundation.

4. A method according to claim 3, wherein the support structure is mounted on the foundation with a block therebetween.

5. A method according to claim 4, wherein the block comprises a vibration absorbing assembly thereby preventing transmission of vibration from the foundation.

6. A method according to claim 3, wherein the foundation is the ground or a base structure.

7. A method according to claim 6, wherein the stage is located between the exposure device and the foundation; and
the drive has a first portion, located between the exposure device and the foundation, which is connected to the stage and a second portion, located other than between the exposure device and the foundation, which is connected to the reaction frame.

8. A method according to claim 7, wherein the support structure has at least three spaced apart blocks on the foundation.

9. A method according to claim 7, wherein the first portion of the drive is electromagnetically coupled to the stage.

10. A method according to claim 7, wherein the exposure device includes a projection system which projects the image.

11. A method according to claim 10, wherein the projection system optically projects the image.

12. A method according to claim 7, wherein the exposure device includes a mask holder which holds a mask which defines the image.

13. A method according to claim 7, wherein the reaction frame has at least one support post which extends downward to rest on the foundation, and the second portion of the drive is connected to the support post.

14. A method according to claim 1, wherein the exposure device includes a mask holder which holds a mask which defines the image.

15. A method according to claim 1, wherein the exposure device includes a projection system which projects the image.

16. A method according to claim 15, wherein the projection system optically projects the image.

17. A method according to claim 15, wherein the exposure device includes a mask holder which holds a mask which defines said image.

18. A method according to claim 17, wherein the projection system is disposed between the mask and the object.

19. A method according to claim 1, wherein the stage is a wafer stage on which the object is supported.

20. A method according to claim 1, wherein the stage is a guideless stage, thereby having no associated guide member to guide its movement.

21. A method according to claim 20, wherein the support structure includes a base and the guideless stage is two-dimensionally movable over a surface of the base on a bearing.

22. A method according to claim 21, wherein the bearing is a non-contact bearing which supports the guideless stage.

23. A method according to claim 22, wherein the bearing comprises an air bearing.

24. A method according to claim 22, wherein the bearing includes a magnet and a cooperating coil.

25. A method according to claim 1, wherein the drive comprises a linear motor.

26. A method according to claim 1, wherein the drive rotates the stage on its axis.

27. A method according to claim 1, wherein the drive moves the stage in a two-dimensional plane, including movement in the plane in a first linear direction, a second linear direction and a rotative direction on an axis of the stage.

28. A method according to claim 1, wherein the drive includes a first portion mounted on the reaction frame and a second portion connected to the stage and movable relative to the first portion.

29. A method according to claim 28, further comprising providing a drive mechanism which moves the first portion.

30. A method according to claim 28, wherein the first portion comprises a drive track and the second portion comprises a drive coil.

31. A method for making an exposure apparatus which transfers an image onto an object, comprising:
providing a base;
providing a guideless stage movably supported on said base to move two-dimensionally, the guideless stage thereby having no associated guide member to guide its movement;
providing a drive which drives the guideless stage; and
providing a reaction frame which is spaced apart from the base, wherein a reaction force caused by the movement of the guideless stage is transferred to the reaction frame.

32. A method according to claim 31, wherein the guideless stage is a wafer stage on which the object is supported.

33. A method according to claim 31, wherein the drive moves the guideless stage rotatively on its axis.

34. A method according to claim 31, wherein the drive comprises a plurality of actuators.

35. A method according to claim 31, wherein the drive includes a first portion mounted on the reaction frame and a second portion connected to the stage and movable relative to the first portion.

36. A method of operating an exposure apparatus to transfer an image onto an object, the apparatus having a support structure, an exposure device supported on the support structure to expose the image onto the object, a stage movably supported by the support structure, a reaction frame which is dynamically isolated from the support structure, and a drive at least partly supported on the reaction frame to move the stage, the method comprising:
moving the stage by the drive;
transferring a reaction force caused by the movement of the stage substantially to the reaction frame.

37. An object on which an image has been exposed by an exposure apparatus operated by the method according to claim 36.

38. A method according to claim 36, wherein the support structure and the reaction frame are supported on a foundation.

39. A method according to claim 38, wherein the support structure is mounted on the foundation with a block therebetween.

40. A method according to claim 39, wherein the block comprises a vibration absorbing assembly, thereby preventing transmission of vibration from the foundation.

41. A method according to claim 38, wherein the foundation is the ground or a base structure.

42. A method according to claim 41, wherein the stage is located between the exposure device and the foundation; and
the drive has a first portion, located between the exposure device and the foundation, which is connected to the stage device and a second portion, located other than between the exposure device and the foundation, which is connected to the reaction frame.

43. A method according to claim 42, wherein the support structure includes at least three spaced apart blocks on the foundation.

44. A method according to claim 42, wherein the first portion of the drive is electromagnetically coupled to the stage.

45. A method according to claim 42, wherein the exposure device includes a projection system which projects the image.

46. A method according to claim 45, wherein the projection system optically projects the pattern.

47. A method according to claim 42, wherein the exposure device includes a mask holder which holds a mask which defines the image.

48. A method according to claim 41, wherein the reaction frame has at least one support post which extends downward to rest on the foundation, and the second portion of the drive is connected to the support post.

49. A method according to claim 36, wherein the exposure device includes a mask holder which holds a mask which defines said image.

50. A method according to claim 36, wherein the exposure device includes a projection system which projects the image.

51. A method according to claim 50, wherein the projection system optically projects the image.

52. A method according to claim 50, wherein the exposure device includes a mask holder which holds a mask which defines said image.

53. A method according to claim 52, wherein the projection system is disposed between the mask and the object.

54. A method according to claim 36, wherein the stage is a wafer stage which supports the object.

55. A method according to claim 36, wherein the stage is a guideless stage, thereby having no associated guide member to guide its movement.

56. A method according to claim 55, wherein the support structure includes a base and the guideless stage is two-dimensionally movable over a surface of the base on a bearing.

57. A method according to claim 56, wherein the bearing is a non-contact bearing which supports the guideless stage on the base.

58. A method according to claim 57, wherein the bearing comprises an air bearing.

59. A method according to claim 57, wherein the bearing includes a magnet and a cooperating coil.

60. A method according to claim 36, wherein the drive comprises a linear motor.

61. A method according to claim 36, wherein the drive rotates the stage on its axis.

62. A method according to claim 36, wherein the drive moves the stage in a twodimensional plane, including movement in the plane in a first linear direction, a second linear direction and a rotative direction on an axis.

63. A method according to claim 36, wherein the drive includes a first portion mounted on the reaction frame and a second portion connected to the stage and movable relative to the first portion.

64. A method according to claim 63, further comprising moving the first portion.

65. A method according to claim 63, wherein the first portion comprises a drive track and the second portion comprises a cooperating drive coil.

\* \* \* \* \*